(12) United States Patent
Kim

(10) Patent No.: US 11,373,919 B2
(45) Date of Patent: Jun. 28, 2022

(54) SEMICONDUCTOR PACKAGE HAVING A SEMICONDUCTOR CHIP AND OUTER CONNECTION MEMBERS ARRANGED IN A CONNECTION REGION AND METHOD OF MANUFACTURING SEMICONDUCTOR PACKAGE

(71) Applicant: SAMSUNG ELECTRONICS CO., LTD., Suwon-si (KR)

(72) Inventor: Wonyoung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/004,559

(22) Filed: Aug. 27, 2020

(65) Prior Publication Data

US 2021/0249323 A1 Aug. 12, 2021

(30) Foreign Application Priority Data

Feb. 10, 2020 (KR) ........................ 10-2020-0015694

(51) Int. Cl.
*H01L 23/31* (2006.01)
*H01L 23/00* (2006.01)
*H01L 23/498* (2006.01)
*H01L 21/56* (2006.01)

(52) U.S. Cl.
CPC ........ *H01L 23/3185* (2013.01); *H01L 21/561* (2013.01); *H01L 23/49822* (2013.01);
(Continued)

(58) Field of Classification Search
CPC ........... H01L 23/3185; H01L 23/49822; H01L 24/05; H01L 24/13; H01L 24/14; H01L 24/97; H01L 2224/16225; H01L 2224/02377; H01L 2224/02379; H01L 2224/02331; H01L 2224/02381; H01L 2224/13024; H01L 2224/14134; H01L 2224/023; H01L 2224/0231
(Continued)

(56) References Cited

U.S. PATENT DOCUMENTS 6,897,566 B2 5/2005 Su
7,327,041 B2 2/2008 Dotta et al.
(Continued)

FOREIGN PATENT DOCUMENTS

JP 2003-0179182 A 6/2003
JP 3841060 B2 11/2006
KR 10-0881394 B1 1/2009

*Primary Examiner* — Khiem D Nguyen
(74) *Attorney, Agent, or Firm* — Lee IP Law, PC

(57) ABSTRACT

A semiconductor package includes a semiconductor chip having chip pads on a first surface and having first and second side surfaces opposite to each other and third and fourth side surfaces opposite to each other, a molding member covering the third and fourth side surfaces and exposing the first and second side surfaces of the semiconductor chip, a redistribution wiring layer on a lower surface of the molding member to cover the first surface of the semiconductor chip and including a plurality of redistribution wirings electrically connected to the chip pads, and outer connection members arranged in a connection region defined on an outer surface of the redistribution wiring layer and electrically connected to the redistribution wirings.

20 Claims, 25 Drawing Sheets

(52) U.S. Cl.
CPC .............. *H01L 24/05* (2013.01); *H01L 24/13* (2013.01); *H01L 24/14* (2013.01); *H01L 24/97* (2013.01); *H01L 2224/02331* (2013.01); *H01L 2224/02377* (2013.01); *H01L 2224/02379* (2013.01); *H01L 2224/02381* (2013.01); *H01L 2224/13024* (2013.01); *H01L 2224/14134* (2013.01); *H01L 2224/16225* (2013.01)

(58) Field of Classification Search
USPC ......................................................... 257/737
See application file for complete search history.

(56) References Cited

U.S. PATENT DOCUMENTS

| | | | |
|---|---|---|---|
| 8,241,968 B2 | 8/2012 | Lee et al. | |
| 8,736,047 B2 | 5/2014 | Yoshimi et al. | |
| 8,778,735 B1 | 7/2014 | Xue et al. | |
| 9,202,769 B2* | 12/2015 | Lin | H01L 23/3121 |
| 10,141,286 B2* | 11/2018 | Lee | H01L 23/3114 |
| 2006/0231950 A1* | 10/2006 | Yoon | H01L 24/48 |
| | | | 257/737 |
| 2007/0269931 A1* | 11/2007 | Chung | H01L 29/0657 |
| | | | 438/109 |
| 2012/0133001 A1* | 5/2012 | Tkaczyk | A61B 8/4483 |
| | | | 257/414 |
| 2014/0225230 A1* | 8/2014 | Kim | H01L 21/563 |
| | | | 257/620 |
| 2015/0187742 A1* | 7/2015 | Kwon | H01L 21/568 |
| | | | 257/774 |
| 2016/0233189 A1* | 8/2016 | Shimote | H01L 24/81 |
| 2016/0284654 A1* | 9/2016 | Yu | H01L 24/05 |

* cited by examiner

SEMICONDUCTOR PACKAGE HAVING A SEMICONDUCTOR CHIP AND OUTER CONNECTION MEMBERS ARRANGED IN A CONNECTION REGION AND METHOD OF MANUFACTURING SEMICONDUCTOR PACKAGE

CROSS-REFERENCE TO RELATED APPLICATION

Korean Patent Application No. 10-2020-0015694, filed on Feb. 10, 2020, in the Korean Intellectual Property Office, and entitled: "Semiconductor Package and Method of Manufacturing Semiconductor Package," is incorporated by reference herein in its entirety.

BACKGROUND

1. Field

Embodiments relate to a semiconductor package and a method of manufacturing the semiconductor package.

2. Description of the Related Art

A memory module may include fan out semiconductor packages mounted therein. Channel lengths between solder balls of the semiconductor package and input/output terminals of a module substrate may affect high speed characteristics.

SUMMARY

Embodiments are directed to a semiconductor package, including a semiconductor chip having chip pads on a first surface and having first and second side surfaces extending in a direction parallel with a first direction perpendicular to the first surface and opposite to each other and third and fourth side surfaces extending in a direction parallel with a second direction perpendicular to the first direction and opposite to each other, a molding member covering the third and fourth side surfaces and exposing the first and second side surfaces of the semiconductor chip, a redistribution wiring layer on a lower surface of the molding member to cover the first surface of the semiconductor chip and including a plurality of redistribution wirings electrically connected to the chip pads, and outer connection members arranged in a connection region defined on an outer surface of the redistribution wiring layer and electrically connected to the redistribution wirings. When viewed in plan view, the first and second side surfaces of the semiconductor chip may be positioned outside the connection region, and the third and fourth side surfaces of the semiconductor chip may be positioned within the connection region.

Embodiments are also directed to a semiconductor package, including a semiconductor chip having chip pads on a first surface, having first and second side surfaces extending in a direction parallel with a first direction perpendicular to the first surface and opposite to each other, and having third and fourth side surfaces extending in a direction parallel with a second direction perpendicular to the first direction and opposite to each other, a molding member covering the third and fourth side surfaces and exposing the first and second side surfaces of the semiconductor chip, a redistribution wiring layer on a lower surface of the molding member to cover the first surface of the semiconductor chip and including a plurality of redistribution wirings electrically connected to the chip pads, and outer connection members arranged in a connection region defined on an outer surface of the redistribution wiring layer, and electrically connected to the redistribution wirings. A length in the second direction of the connection region may be less than a distance between the first and second side surfaces of the semiconductor chip, and a length in the first direction of the connection region may be greater than a distance between the third and fourth side surfaces.

Embodiments are also directed to a semiconductor package, including a redistribution wiring layer including a plurality of redistribution wirings, a semiconductor chip arranged on an upper surface of the redistribution wiring layer, having chip pads on a first surface, having first and second side surfaces extending in a direction parallel with a first direction perpendicular to the first surface and opposite to each other, and having third and fourth side surfaces extending in a direction parallel with a second direction perpendicular to the first direction and opposite to each other, a molding member on the upper surface of the redistribution wiring layer, covering the third and fourth side surfaces and exposing the first and second side surfaces of the semiconductor chip, and outer connection members arranged in a connection region defined on a lower surface of the redistribution wiring layer, and electrically connected to the redistribution wirings.

Embodiments are also directed to a semiconductor package as a fan out package, including a molding member provided on a redistribution wiring layer to expose a first side surface and a second side surface of a semiconductor chip extending in a first direction and opposite to each other and to cover a third side surface and a fourth side surface of the semiconductor chip extending in a second direction and opposite to each other. A connection region of the redistribution wiring layer on which solder balls are disposed may have a fan-in region corresponding to a region between the first side surface and the second side surface of the semiconductor chip and a fan-out region corresponding to a region between the third side surface and the fourth side surface of the semiconductor chip.

BRIEF DESCRIPTION OF THE DRAWINGS

Features will become apparent to those of skill in the art by describing in detail example embodiments with reference to the attached drawings in which.

DETAILED DESCRIPTION

Figure 1:
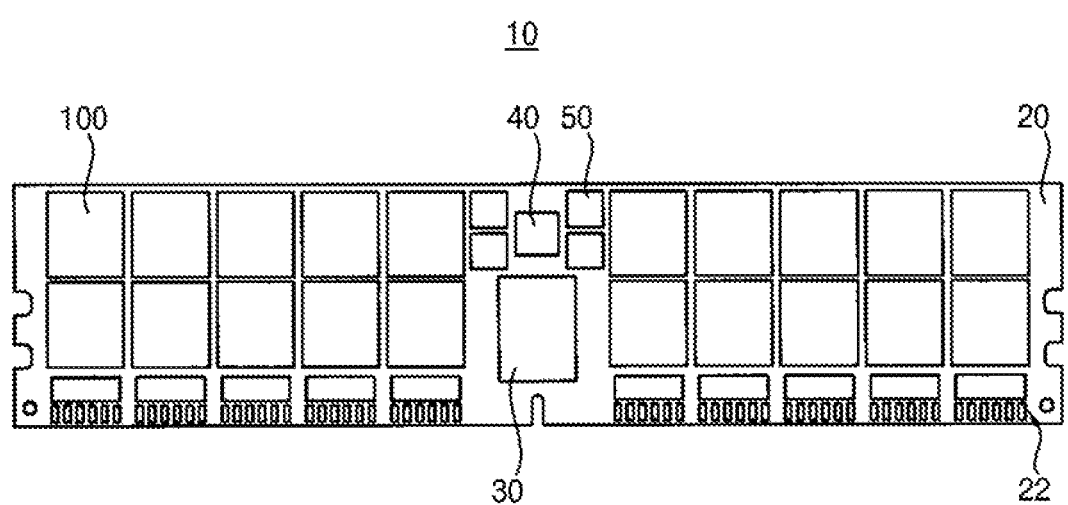
FIG. 1 is a plan view illustrating a memory module in accordance with an example embodiment.

FIG. 1 is a plan view illustrating a memory module in accordance with an example embodiment.

Referring to FIG. 1, a memory module 10 may include a module board 20 and a plurality of electronic elements mounted on the module board 20.

In an example embodiment, the module board 20 may be a single-layered or multi-layered circuit substrate having an upper surface and a lower surface opposite to each other. For example, the module board 20 may be a printed circuit board (PCB). The PCB may include wirings and vias connected to the wirings. The wirings may include printed circuit patterns for interconnection with the electronic elements.

The module board 20 may have a rectangular shape. A connector 22 for connection with a host system (not illustrated) may be provided in a first side portion of the module board 20. The electronic elements may include a controller 30, a power management IC (PMIC) (40), passive devices 50 and semiconductor packages 100. The semiconductor package 100 may include non-volatile memory devices. For example, the non-volatile memory device may include DRAM, NAND Flash Memory, PRAM, MRAM, ReRAM, FRAM, etc.

In an example embodiment, the semiconductor package 100 may be mounted on the module board 20 through outer connection members such as solder balls. The memory module 10 may include dual in-line memory module (DIMM). In this case, the number of the mounted semiconductor packages may be determined according to an international standard. A package pad region (hereinafter, referred to as a connection region) on which the solder balls for electrical connection with the semiconductor package 100 are disposed may be also standardized.

Hereinafter, the semiconductor package 100 in FIG. 1 will be explained.

Figure 2:
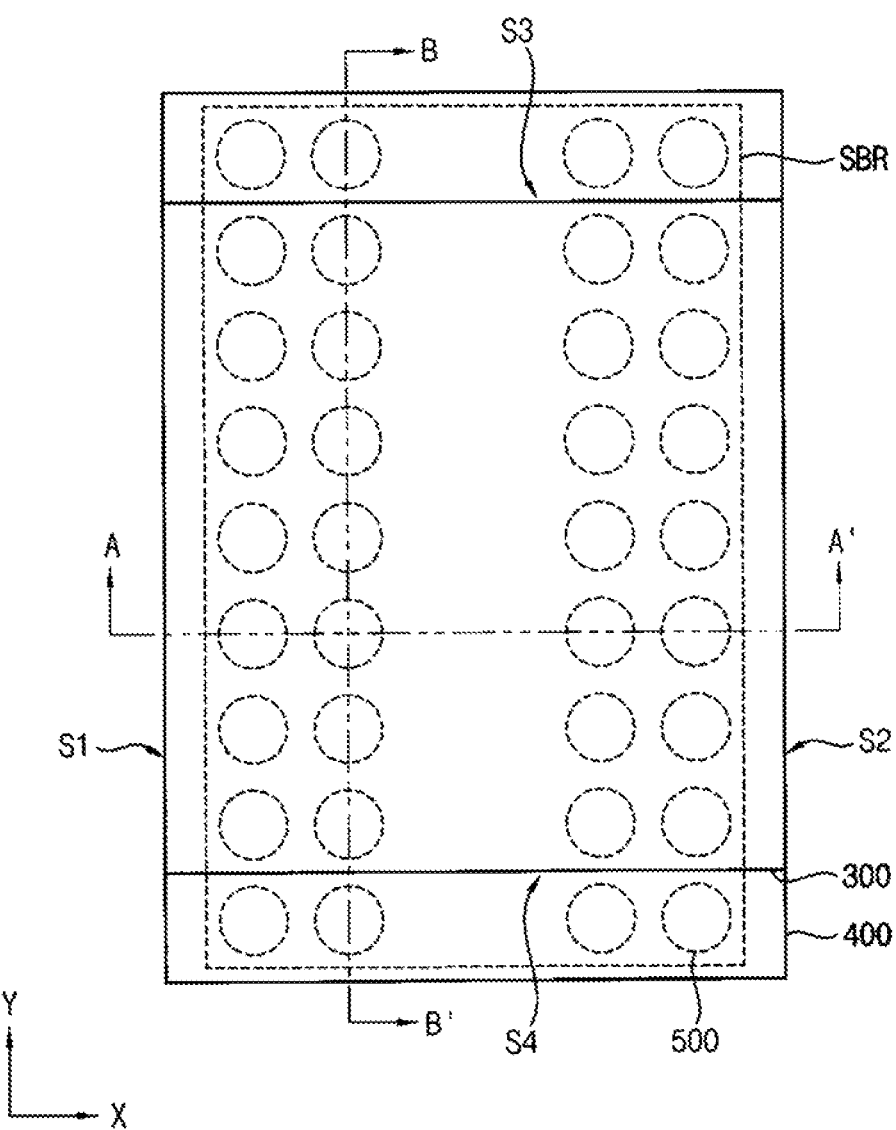
FIG. 2 is a plan view illustrating a semiconductor package in accordance with an example embodiment.
Figure 3:
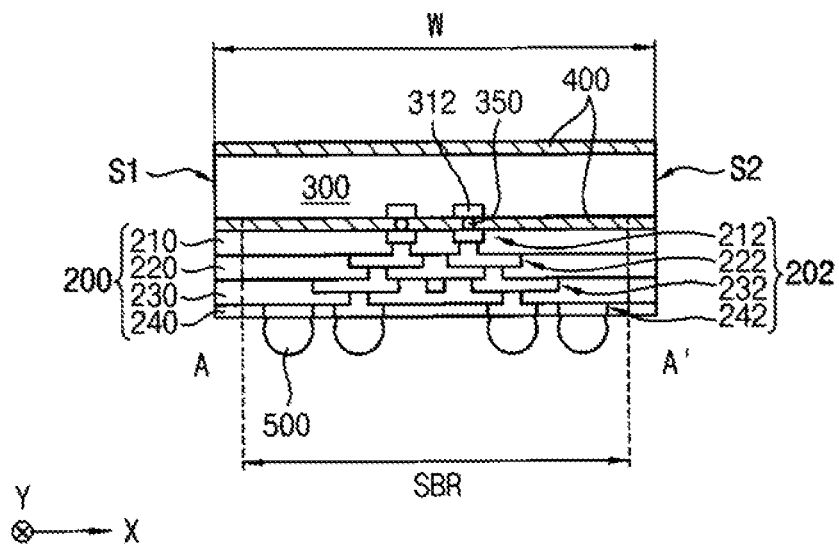
FIG. 3 is a cross-sectional view taken along the line A-A' in FIG. 2.
Figure 4:
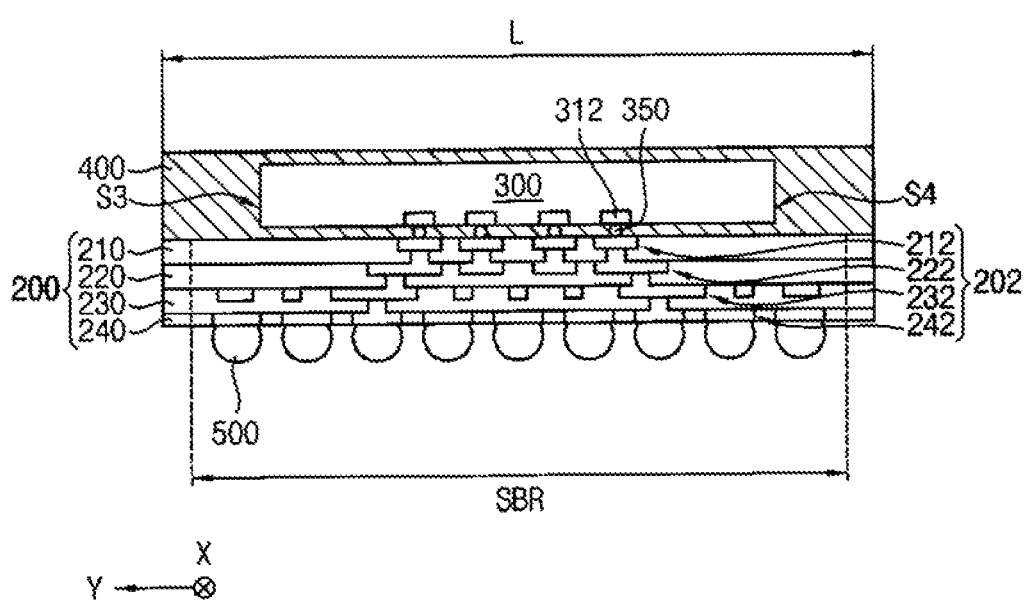
FIG. 4 is a cross-sectional view taken along the line B-B' in FIG. 2.

FIG. 2 is a plan view illustrating a semiconductor package in accordance with an example embodiment. FIG. 3 is a cross-sectional view taken along the line A-A' in FIG. 2. FIG. 4 is a cross-sectional view taken along the line B-B' in FIG. 2.

Referring to FIGS. 2 to 4, the semiconductor package 100 may include a redistribution wiring layer 200, a semiconductor chip 300 disposed on the redistribution wiring layer 200, a molding member 400 on an upper surface of the redistribution wiring layer 200 to cover at least a side surface of the semiconductor chip 300, and outer connection members 500 disposed on a connection region SBR defined on a lower surface of the redistribution wiring layer 200.

In an example embodiment, the semiconductor package 100 may be a fan out package in which the redistribution wiring layer 200 extends under a portion of the molding member 400 covering an outer surface of the semiconductor chip 300. The redistribution wiring layer 200 may be formed by a panel-level redistribution wiring process. Some of the outer connection members 500 may be arranged in a portion of the connection region SBR positioned outside the semiconductor chip 300.

The redistribution wiring layer 200 may include a plurality of insulation layers 210, 220, 230, 240 and redistribution wirings 202 provided in the insulation layers. The redistribution wirings 202 may include first to fourth redistribution wirings 212, 222, 232, 242. The insulation layer may include a polymer layer, a dielectric layer, etc. For example, the insulation layer may include a photosensitive insulation layer such as photo imageable dielectric PID. The insulation layer may be formed by a vapor deposition process, a spin coating process, etc. The redistribution wiring may include aluminum (Al), copper (Cu), tin (Sn), nickel (Ni), gold (Au), platinum (Pt) or an alloy thereof. The redistribution wiring may be formed by a plating process, an electroless plating process, a vapor deposition process, etc.

The first redistribution wiring 212 may be provided in the first insulation layer 210. At least a portion of the first redistribution wiring 212 may serve as a bonding pad. As described below, a conductive bump 350 may be interposed between the bonding pad and a chip pad of the stacked semiconductor chip 300 to electrically connect the semiconductor chip 300 and the first redistribution wiring 212. A portion of an upper surface of the first redistribution wiring 212 may be exposed by the first insulation layer 210. The first insulation layer 210 may have a first opening that exposes a portion of a lower surface of the first redistribution wiring 212.

The second redistribution wiring 222 may be formed on the first insulation layer 210 to be in contact with the first redistribution wiring 212 through the first opening. The second insulation layer 220 may be formed on the first insulation layer 210 and may have a second opening that exposes a portion of the second redistribution wiring 222.

The third redistribution wiring 232 may be formed on the second insulation layer 220 to be in contact with the second redistribution wiring 222 through the second opening. The third insulation layer 230 may be formed on the second insulation layer 220 and may have a third opening that exposes a portion of the third redistribution wiring 232.

The fourth redistribution wiring 242 may be formed on the third insulation layer 230 to be in contact with the third redistribution wiring 232 through the third opening. The fourth insulation layer 240 may be formed on the third insulation layer 230 to expose a portion of the fourth redistribution wiring 242.

At least a portion of the fourth redistribution wiring 242 may serve as a landing pad, that is, a package pad on which the outer connection member 500 such as the solder ball is disposed, as described below.

The connection region SBR as a package pad region may be defined on the lower surface of the redistribution wiring layer 200, and the package pads may be positioned within the connection region SBR. Accordingly, the solder balls may be arranged within the connection region SBR defined on the outer surface of the redistribution wiring layer 200. The SBR region may be a region on the bottom of the redistribution wiring layer 200 that includes or overlaps all the connection members 500, and extends beyond the chip 300 to have some connection members 500 outside (or non-overlapping) the chip 300.

In an example embodiment, the semiconductor chip 300 may have a plurality of chip pads 312 on a first surface (e.g., active surface) thereof. The semiconductor chip 300 may be mounted on the redistribution wiring layer 200 such that the first surface thereof faces toward the redistribution wiring layer 200.

The semiconductor chip 300 may be mounted on the redistribution wiring layer 200 in a flip chip bonding manner. The semiconductor chip 300 may be mounted on the redistribution wiring layer 200 via the conductive bumps 350. The conductive bump 350 may be interposed between the first redistribution wiring 212, that is, the bonding pad of the redistribution wiring layer 200 and the chip pad 312 of the semiconductor chip 300, to electrically connect the semiconductor chip 300 and the first redistribution wiring 212. An underfill member (not illustrated) may be provided between the semiconductor chip 300 and the redistribution wiring layer 200.

Although only some chip pads are illustrated in the figures, structures and arrangements of the chip pads may be varied. Although one semiconductor chip is illustrated in the figure, it may be understood that a plurality of the semiconductor chips may be provided.

In an example embodiment, the semiconductor chip 300 may have a first side surface S1 and a second side surface S2 extending in a direction parallel with a first direction (Y direction) perpendicular to the first surface and opposite to each other, and may have a third side surface S3 and a fourth side surface S4 extending in a direction parallel with a second direction (X direction) perpendicular to the first direction and opposite to each other.

As illustrated in the plan view of FIG. 2, the first side surface S1 and the second side surface S2 of the semiconductor chip 300 may be positioned outside the connection region SBR (fan-in region), and the third side surface S3 and the fourth side surface S4 of the semiconductor chip 300 may be positioned within the connection region SBR (fan-out region). Both sides of a first region of the semiconductor chip 300 between the first side surface S1 and the second side surface S2 may protrude outwardly from the connection region SBR, and both sides of a second region of the semiconductor chip 300 between the third side surface S3 and the fourth side surface S4 may be positioned within the connection region SBR.

In an example embodiment, the molding member 400 may be formed on the redistribution wiring layer 200 to cover at least a portion of the semiconductor chip 300. The molding member 400 may expose the first side surface S1 and the second side surface S2 of the semiconductor chip 300 and may cover the third side surface S3 and the fourth side surface S4 of the semiconductor chip 300. The molding member 400 may include, for example, an epoxy molding compound EMC. The molding member 400 may be formed by a molding process, a screen printing process, a lamination process, etc.

A length in the first direction (Y direction) of the molding member 400 may be the same as a length in the first direction (Y direction) of the redistribution wiring layer 200 and may be a length L of the semiconductor package 100. A length in the second direction (X direction) of the molding member 400 may be the same as a length in the second direction (X direction) of the molding member 400 and may be a width W of the semiconductor package 100.

The outer connection members 500 may be arranged on the package pads within the connection region SBR defined on the lower surface of the redistribution wiring layer 200 to be electrically connected to the redistribution wirings 202. Some of the outer connection members 500 may be positioned outside the third side surface S3 and the fourth side surface S4 of the semiconductor chip 300 to provide the semiconductor package 100 having fan out type solder balls.

In an example embodiment, a length in the second direction (X direction) of the connection region SBR of the redistribution wiring layer 200 on which the solder balls are disposed may be less than a distance between the first side surface S1 and the second side surface S2 of the semiconductor chip 300. A length in the first direction (Y direction) of the connection region SBR may be greater than a distance between the third side surface S3 and the fourth side surface S4.

A length in the second direction (X direction) of the redistribution wiring layer 200 may be the same as the distance between the first side surface S1 and the second side surface S2 of the semiconductor chip 300. A length in the first direction (Y direction) of the redistribution wiring layer 200 may be greater than the distance between the third side surface S3 and the fourth side surface S4.

For example, the length in the second direction (X direction) of the redistribution wiring layer 200 may be within a range of from 7 mm to 9 mm, and the length in the first direction (Y direction) of the redistribution wiring layer 200 may be within a range of from 10 mm to 12 mm. In an example embodiment, the length in the second direction (X direction) of the redistribution wiring layer 200 may be 8.34 mm. The length in the first direction (Y direction) of the redistribution wiring layer 200 may be 11 mm.

The length in the second direction (X direction) of the connection region SBR may be within a range of from 6 mm to 8 mm. The length in the first direction (Y direction) of the connection region SBR may be within a range of from 9 mm to 11 mm. In an example embodiment, the length in the second direction (X direction) of the connection region SBR may be 7 mm. The length in the first direction (Y direction) of the connection region SBR may be 10.5 mm.

A length in the second direction (X direction) of the semiconductor chip 300, that is, the distance between the first side surface S1 and the second side surface S2 may be within a range of from 7 mm to 9 mm. A length in the first direction (Y direction) of the semiconductor chip 300, that is, the distance between the third side surface S3 and the fourth side surface S4, may be within a range of from 7 mm to 10 mm. In an example embodiment, the length in the second direction (X direction) of the semiconductor chip 300 may be 8.34 mm. The length in the first direction (Y direction) of the semiconductor chip 300 may be 8.98 mm.

As discussed above, the semiconductor package 100 as the fan out package may include the molding member 400 provided on the redistribution wiring layer 200 to cover the third side surface S3 and the fourth side surface S4 of the semiconductor chip 300 and to expose the first side surface S1 and the second side surface S2 of the semiconductor chip 300. The standardized connection region SBR of the redistribution wiring layer 200 on which the solder balls are disposed may have the fan-in region corresponding to the region between the first side surface S1 and the second side surface S2 of the semiconductor chip 300 and the fan-out region corresponding to the region between the third side surface S3 and the fourth side surface S4 of the semiconductor chip 300. The length in the second direction (X direction) of the connection region SBR of the redistribution wiring layer 200 (width of the fan-in region) may be less than the distance between the first side surface S1 and the second side surface S2 of the semiconductor chip 300.

Accordingly, the length in the second direction (X direction) of the molding member 400, that is, the width W of the semiconductor package 100, may be minimized while adhering to the standard. Thus, a distance between the solder ball and a terminal of a module substrate may be minimized to thereby secure improved high speed characteristics.

Hereinafter, a method of manufacturing the semiconductor package in FIG. 2 will be described.

Figure 5:
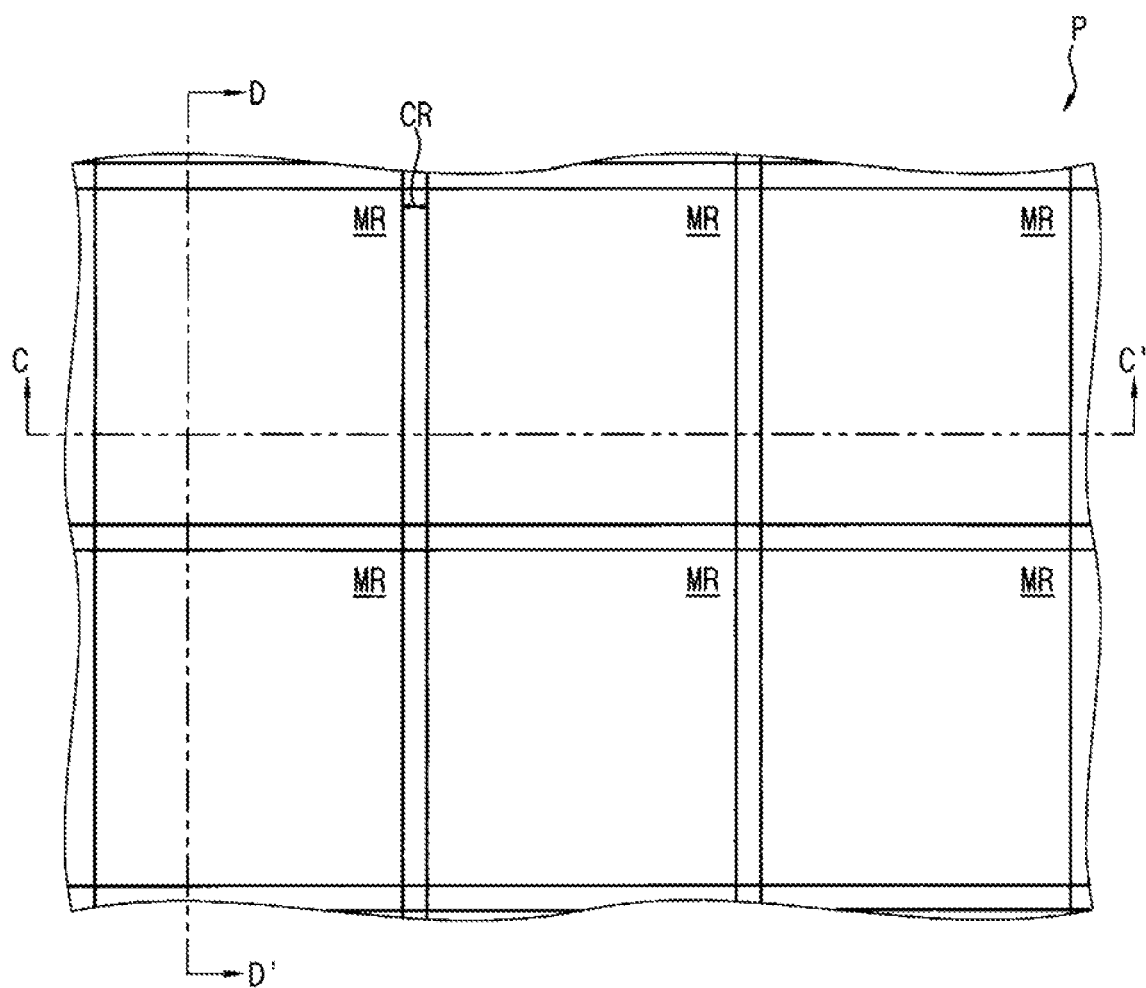
FIGS. 5 to 13 are cross-sectional views illustrating a method of manufacturing a semiconductor package in accordance with an example embodiment.

FIGS. 5 to 13 are cross-sectional views illustrating a method of manufacturing a semiconductor package in accordance with an example embodiment. FIG. 5 is a plan view illustrating a panel substrate. FIGS. 6, 8, 10 and 12 are cross-sectional views taken along the line C-C' in FIG. 5. FIGS. 7, 9, 11 and 13 are cross-sectional views taken along the line D-D' in FIG. 5.

Figure 6:
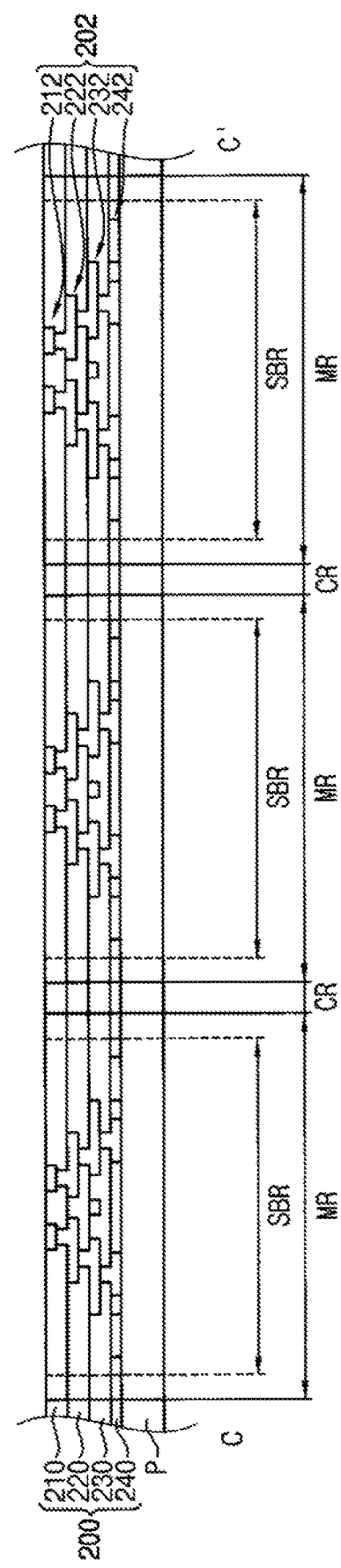
Figure 7:
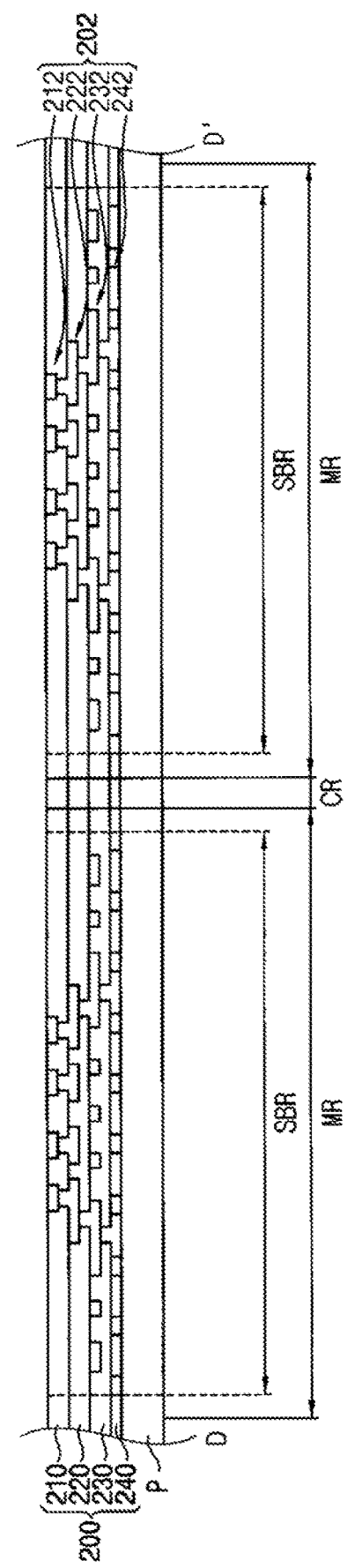

Referring to FIGS. 5 to 7, a redistribution wiring layer 200 may be formed, and then, the redistribution wiring layer 200 may be adhered on a panel substrate P.

In an example embodiment, the panel substrate P may be used as a base substrate on which a plurality of semiconductor chips is arranged to manufacture semiconductor packages having a fan-out panel level package configuration. The panel substrate P may have a shape corresponding to a panel carrier according to the number of the semiconductor chips. A plurality of dies (semiconductor chips) may be arranged on the panel carrier. The panel substrate P may include, for example, a silicon substrate, a glass substrate, or a non-metal or metal plate.

The panel substrate P may include a package region MR in which the semiconductor chip is mounted and a cutting region CR surrounding the package region MR. As described below, the redistribution wiring layer 200 on the panel substrate P may be cut along the cutting region CR dividing a plurality of the package regions MR.

As illustrated in FIGS. 6 and 7, the redistribution wiring layer 200 may include a plurality of insulation layers 210, 220, 230, 240, and redistribution wirings 202 provided in the insulation layers.

The insulation layer may include a polymer layer, a dielectric layer, etc. For example, the insulation layer may include a photosensitive insulation layer such as photo imageable dielectric. The insulation layer may be formed by a vapor deposition process, a spin coating process, etc. The redistribution wiring may include aluminum (Al), copper (Cu), tin (Sn), nickel (Ni), gold (Au), platinum (Pt), or an alloy thereof. The redistribution wiring may be formed by a plating process, an electroless plating process, a vapor deposition process, etc.

The redistribution wirings 202 may include first to fourth redistribution wirings 212, 222, 232, 242. The first redistribution wiring 212 may be provided in the first insulation layer 210. At least a portion of the first redistribution wiring 212 may serve as a bonding pad. As described below, a conductive bump may be interposed between the bonding pad and a chip pad of the stacked semiconductor chip to electrically connect the semiconductor chip and the first redistribution wiring. The first insulation layer 210 may have a first opening that exposes a portion of the first redistribution wiring 212.

The second redistribution wiring 222 may be formed on the first insulation layer 210 to be in contact with the first redistribution wiring 212 through the first opening. The second insulation layer 220 may be formed on the first insulation layer 210 and may have a second opening that exposes a portion of the second redistribution wiring 222.

The third redistribution wiring 232 may be formed on the second insulation layer 220 to be in contact with the second redistribution wiring 222 through the second opening. The third insulation layer 230 may be formed on the second insulation layer 220 and may have a third opening that exposes a portion of the third redistribution wiring 232.

The fourth redistribution wiring 242 may be formed on the third insulation layer 230 to be in contact with the third redistribution wiring 232 through the third opening. The fourth insulation layer 240 may be formed on the third insulation layer 230 to expose a portion of the fourth redistribution wiring 242.

At least a portion of the fourth redistribution wiring 242 may serve as a landing pad, that is, a package pad on which an outer connection member such as a solder ball is disposed, as described below.

The number, sizes, arrangements, etc., of the insulation layers of the redistribution wiring layer may be varied from those illustrated.

In an example embodiment, the fourth insulation layer 240 of the redistribution wiring layer 200 may be adhered on the panel substrate P by a separation layer. The separation layer may include a polymer tape acting as a temporary adhesive. The separation layer may include a material capable of losing adhesive strength when it is subjected to light or heat. The separation layer may include an adhesive member such as thermal release tape. In an implementation, the separation layer may include, for example, dual curing silicone adhesive capable of cross-linking upon exposure to visible light or ultraviolet radiation.

Figure 8:
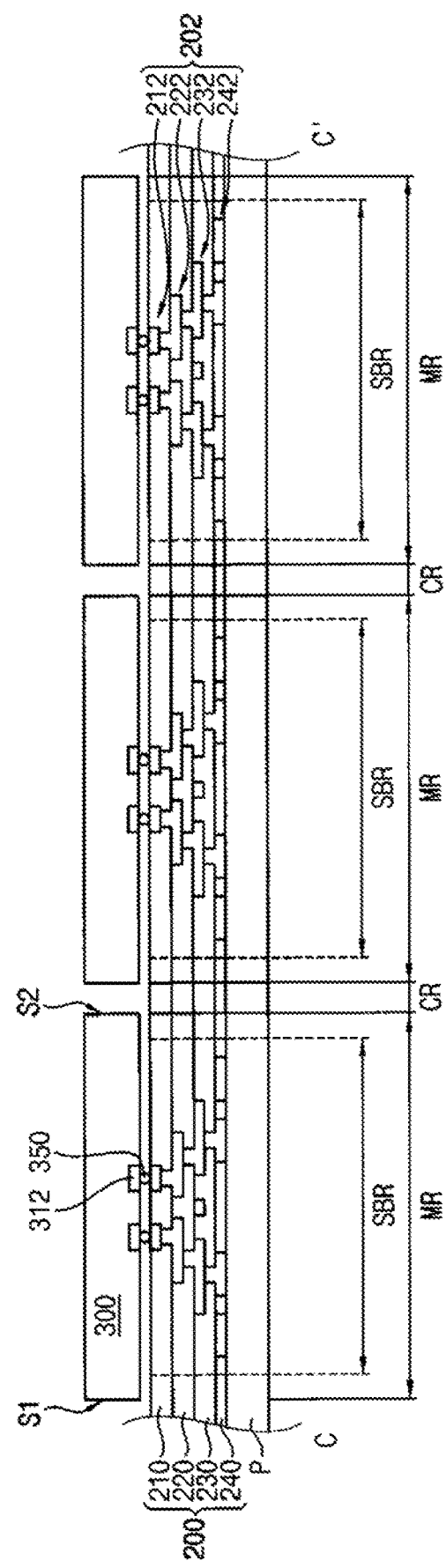
Figure 9:
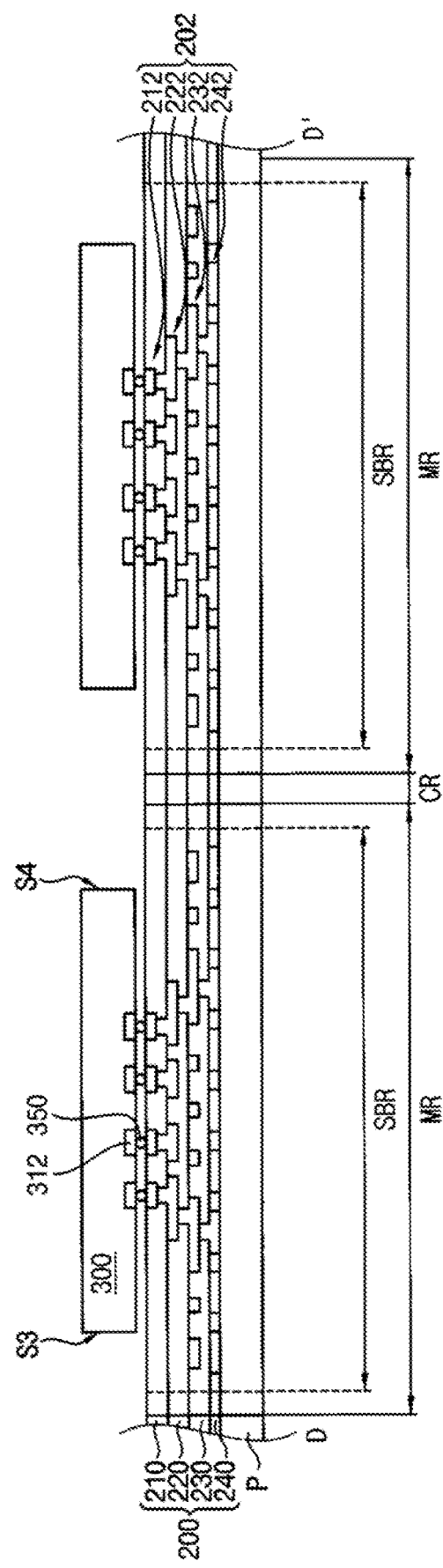

Referring to FIGS. 8 and 9, a semiconductor chip 300 may be mounted on the redistribution wiring layer 200.

In an example embodiment, the semiconductor chips 300 may be arranged on the redistribution wiring layer 200 in the package regions MR of the panel substrate P, respectively. Chip pads 312 may be arranged on a first surface (e.g., active surface) of the semiconductor chip 300. The semiconductor chip 300 may be disposed on the redistribution wiring layer 200 such that the first surface thereof faces toward the redistribution wiring layer 200.

The semiconductor chip 300 may be mounted on the redistribution wiring layer 200 in a flip chip bonding manner. The semiconductor chip 300 may be mounted on the redistribution wiring layer 200 via conductive bumps 350. The conductive bump 350 may be interposed between the first redistribution wiring 212, that is, the bonding pad of the redistribution wiring layer 200 and the chip pad 312 of the semiconductor chip 300. In an example embodiment, an underfill member may be injected between the semiconductor chip 300 and the redistribution wiring layer 200.

In an example embodiment, the semiconductor chip 300 may have a first side surface S1 and a second side surface S2 extending in a direction parallel with a first direction perpendicular to the first surface and opposite to each other, and a third side surface S3 and a fourth side surface S4 extending in a direction perpendicular to a second direction perpendicular to the first direction and opposite to each other.

When viewed in plan view, both sides of a first region of the semiconductor chip 300 between the first side surface S1 and the second side surface S2 may protrude outwardly from a connection region SBR, and both sides of a second region of the semiconductor chip 300 between the third side surface S3 and the fourth side surface S4 may be positioned within the connection region SBR.

Figure 10:
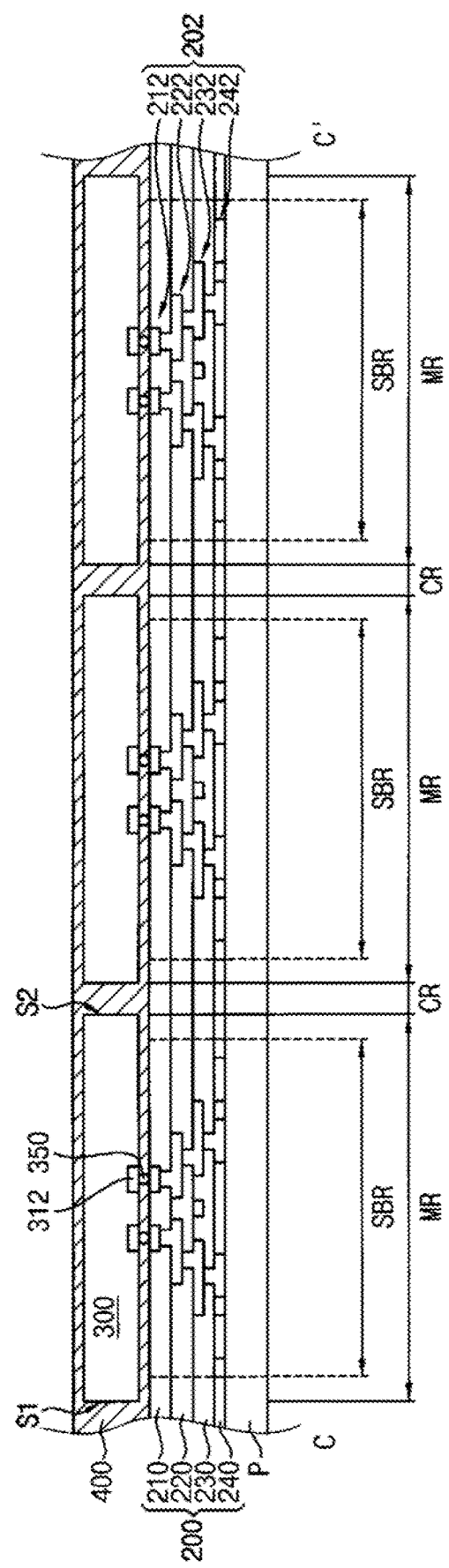
Figure 11:
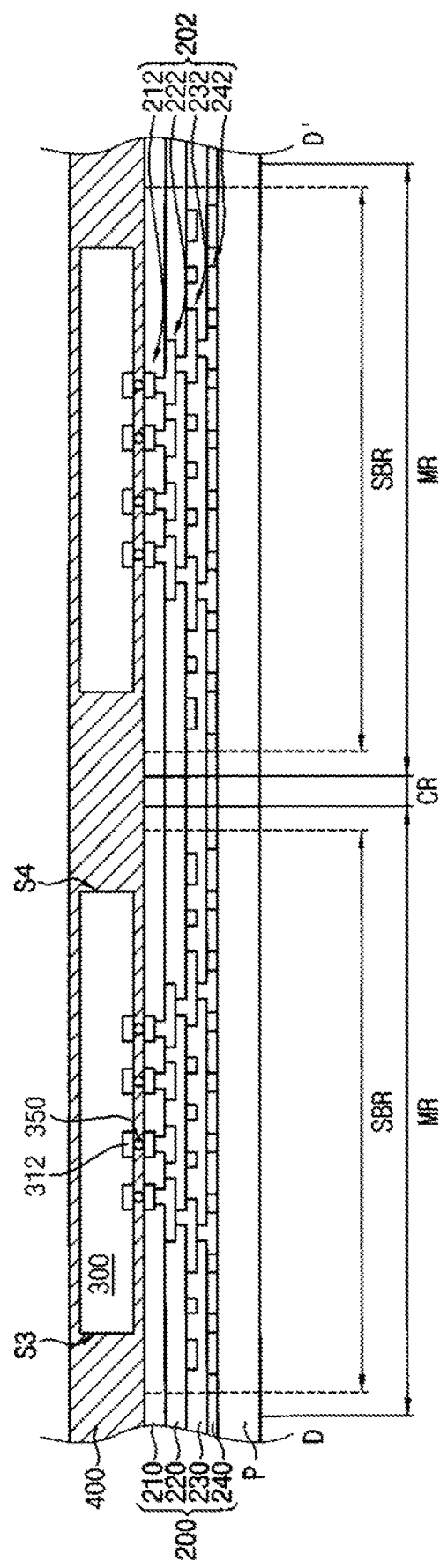

Referring to FIGS. 10 and 11, a molding member 400 may be formed on the redistribution wiring layer 200 to cover the semiconductor chips 300.

In an example embodiment, the molding member 400 may cover side surfaces and an upper surface (second surface) of the semiconductor chip 300. The molding member 400 may include, for example, an epoxy molding compound EMC. The molding member 400 may be formed by a molding process, a screen printing process, a lamination process, etc. In an implementation, the molding member 400 may expose the second surface of the semiconductor chip 300 and may cover only the side surfaces of the semiconductor chip 300.

Figure 12:
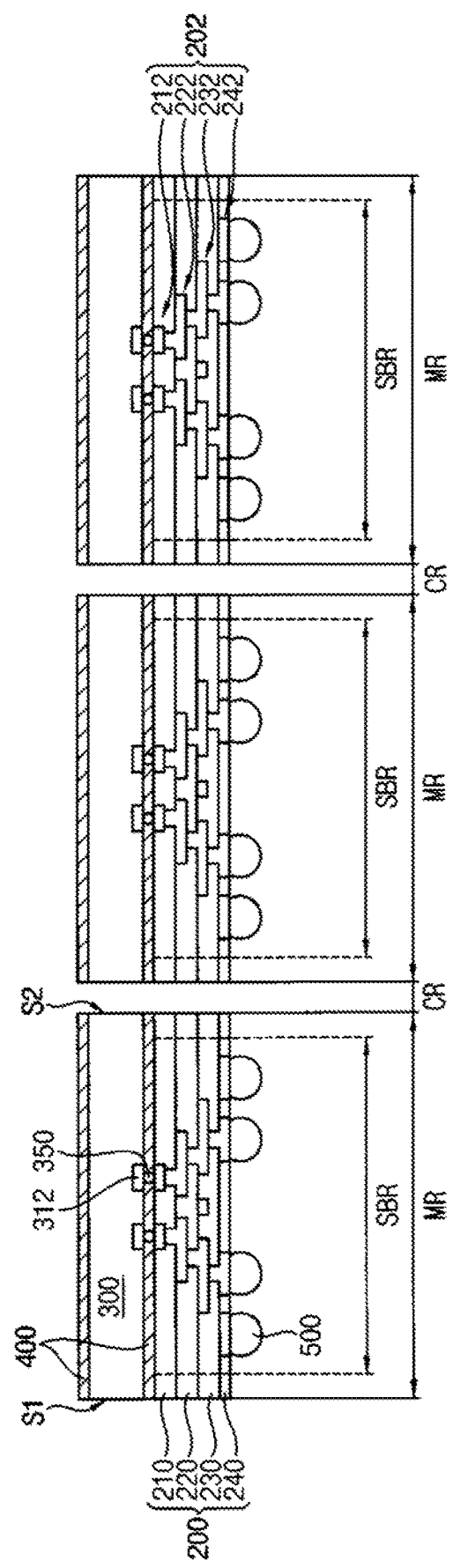
Figure 13:
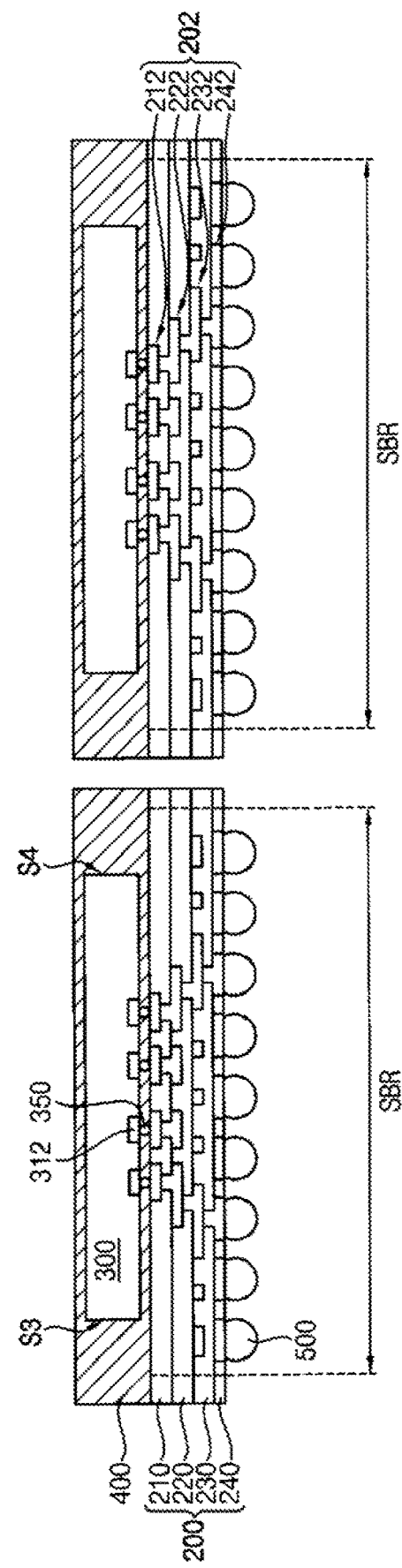

Referring to FIGS. 12 and 13, outer connection members 500 may be disposed on an outer surface of the redistribution wiring layer 200, and then, the molding member 400 and the redistribution wiring layer 200 may be cut to form individual semiconductor packages.

In an example embodiment, the outer connection members 500 such as solder balls may be disposed on the fourth redistribution wirings 242, that is, on the package pads. The outer connection members 500 may be arranged within the connection region SBR defined on a lower surface of the redistribution wiring layer 200.

In another example embodiment, the operation of arranging the outer connection members 500 may be performed right after the step of forming the redistribution wiring layer. In this case, a capping member may be formed on the outer surface of the redistribution wiring layer 200 to cover the outer connection members 500. The capping member may be removed after the operation of the forming the molding member 400.

Then, the redistribution wiring layer 200 may be divided by a sawing process to complete a fan out package.

The molding member 400 may be partially removed by the sawing process to expose the first side surface S1 and the second side surface S2 of the semiconductor chip 300. On the other hand, the molding member 400 may be formed to surround the third side surface S3 and the fourth side surface S4 of the semiconductor chip 300.

Figure 14:
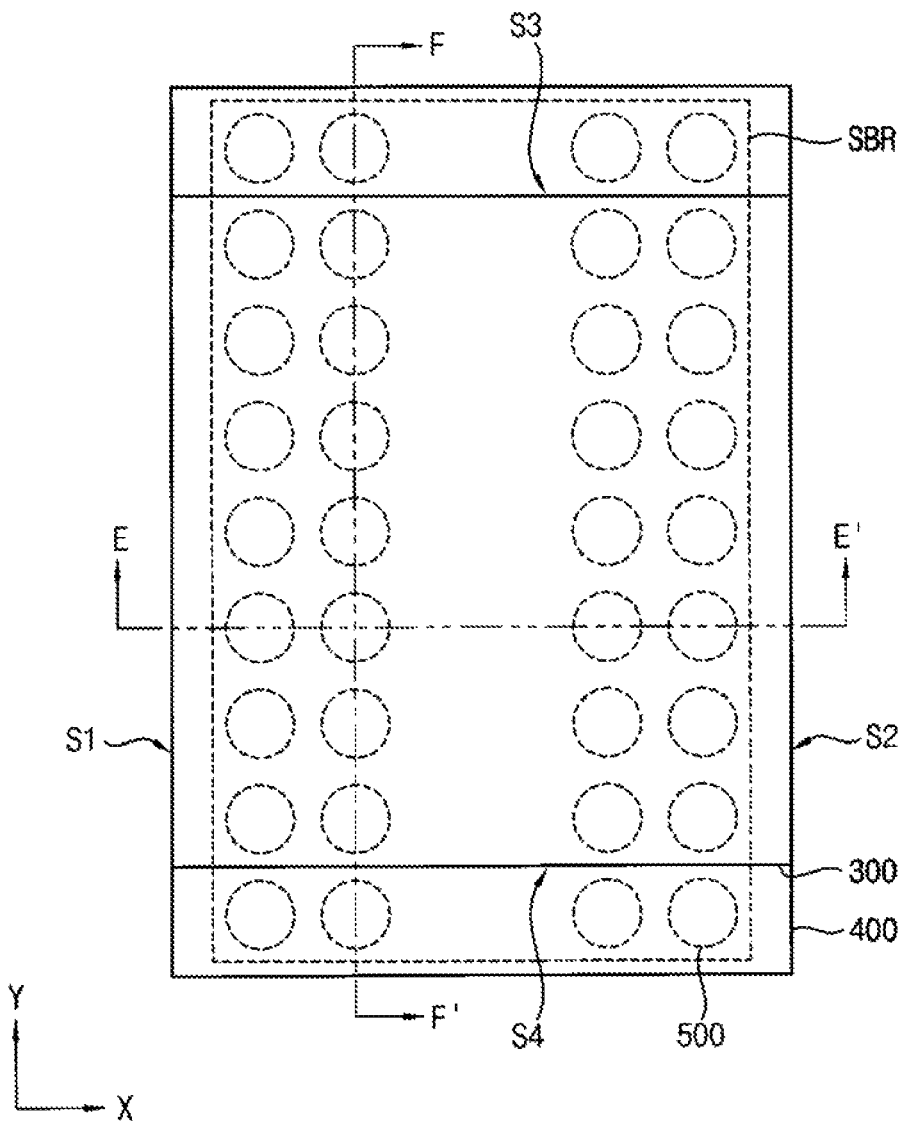
FIG. 14 is a plan view illustrating a semiconductor package in accordance with an example embodiment.
Figure 15:
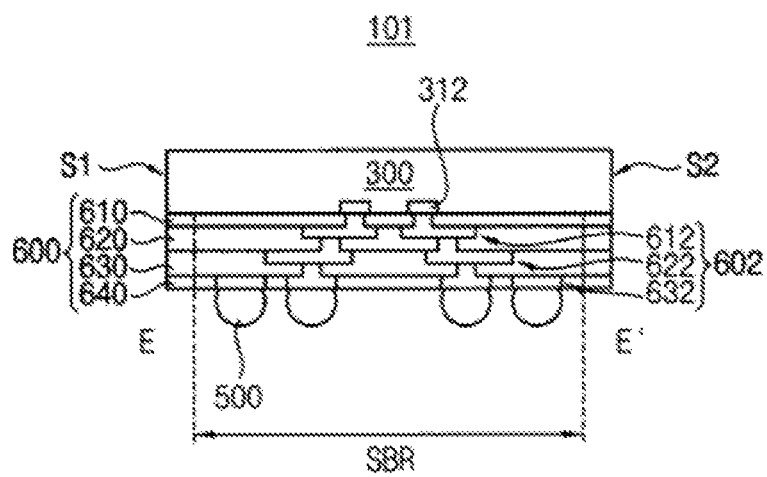
FIG. 15 is a cross-sectional view taken along the line E-E' in FIG. 14.
Figure 16:
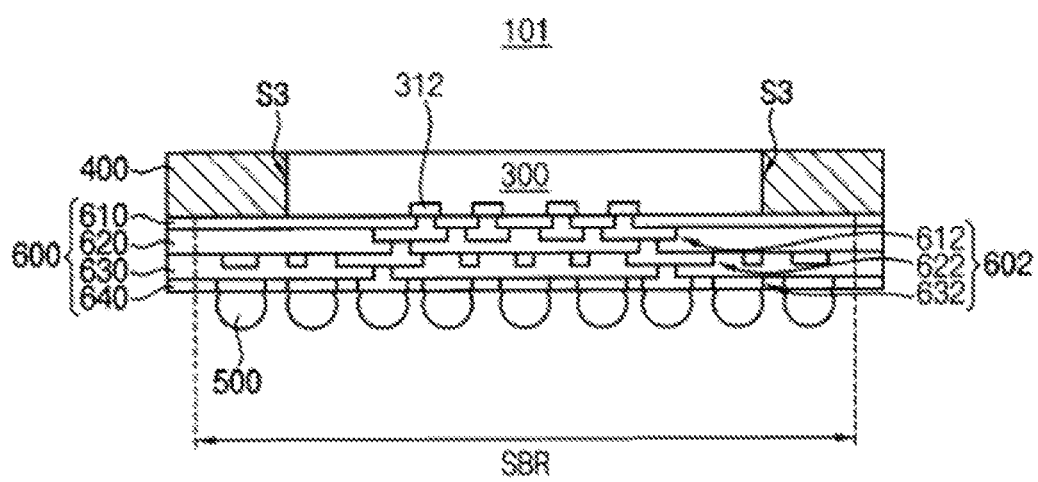
FIG. 16 is a cross-sectional view taken along the line F-F' in FIG. 14.

FIG. 14 is a plan view illustrating a semiconductor package in accordance with an example embodiment. FIG. 15 is a cross-sectional view taken along the line E-E' in FIG. 14. FIG. 16 is a cross-sectional view taken along the line F-F' in FIG. 14. The semiconductor package may be substantially the same as or similar to the semiconductor package described with reference to FIGS. 2 to 4 except for a configuration of a redistribution wiring layer. Thus, same reference numerals will be used to refer to the same or like elements and a repetitive explanation concerning the above elements may be omitted.

Referring to FIGS. 14 to 16, a semiconductor package 101 may include a redistribution wiring layer 600, a semiconductor chip 300 disposed on the redistribution wiring layer 600, a molding member 400 on an upper surface of the redistribution wiring layer 600 to cover at least a side surface of the semiconductor chip 300, and outer connection members 500 disposed on a connection region SBR defined on a lower surface of the redistribution wiring layer 600.

In an example embodiment, the semiconductor chip 300 may have a plurality of chip pads 312 on a first surface (e.g., active surface) thereof. The semiconductor chip 300 may be received in the molding member 400 such that the first surface thereof faces toward the redistribution wiring layer 600. A second surface opposite to the first surface of the semiconductor chip 300 may be exposed by the molding member 400.

The redistribution wiring layer 600 may include a first insulation layer 610 formed on a lower surface of the molding member 400 and having first openings that expose the chip pads 312 respectively, and first redistribution wirings 612 formed on the first insulation layer 610 and of which at least portions directly contact the first redistribution wirings 612 through the first openings, respectively.

The redistribution wiring layer 600 may include a second insulation layer 620 formed on the first insulation layer 610 and having second openings that expose the first redistribution wirings 612 respectively, and second redistribution wirings 622 formed on the second insulation layer 620 and of which at least portions directly contact the second redistribution wirings 622 through the second openings respectively.

The redistribution wiring layer 600 may include a third insulation layer 630 formed on the second insulation layer 620 and having third openings that expose the second redistribution wirings 622 respectively, and third redistribution wirings 632 formed on the third insulation layer 630 and of which at least portions directly contact the third redistribution wirings 632 through the third openings respectively.

The redistribution wiring layer 600 may include a fourth insulation layer 640 formed on the third insulation layer 630 and may expose at least portions of the third redistribution wirings 632.

The outer connection members 500 may be arranged on portions of the third redistribution wirings 632. For example, the outer connection member 500 may include a solder ball. In this case, the portion of the third redistribution wiring 632 may serve as a landing pad, that is, a package pad.

In an example embodiment, the semiconductor package 101 may further include a heat dissipating member such as a heat slug on the exposed second surface of the semiconductor chip 300.

Hereinafter, a method of manufacturing the semiconductor package in FIG. 14 will be described.

Figure 17:
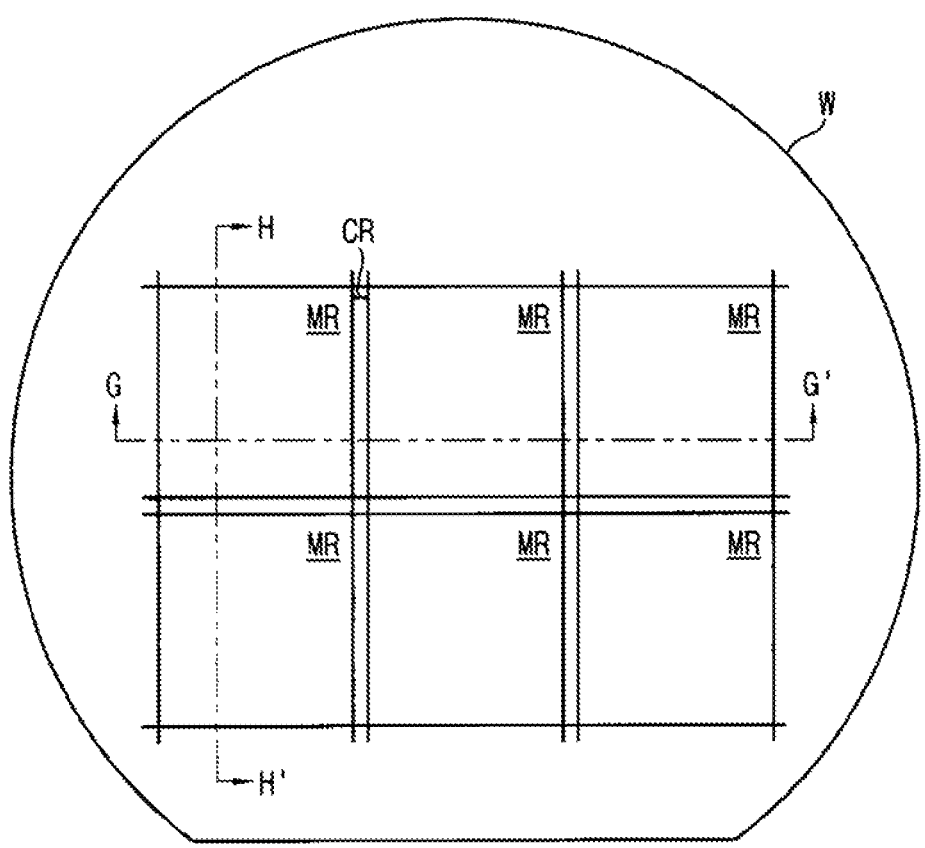
FIGS. 17 to 25 are cross-sectional views illustrating a method of manufacturing a semiconductor package in accordance with an example embodiment.

FIGS. 17 to 25 are cross-sectional views illustrating a method of manufacturing a semiconductor package in accordance with an example embodiment. FIG. 17 is a plan view illustrating a wafer substrate. FIGS. 18, 20, 22 and 24 are cross-sectional views taken along the line G-G' in FIG. 17. FIGS. 19, 21, 23 and 25 are cross-sectional views taken along the line F-F" in FIG. 5.

Figure 18:
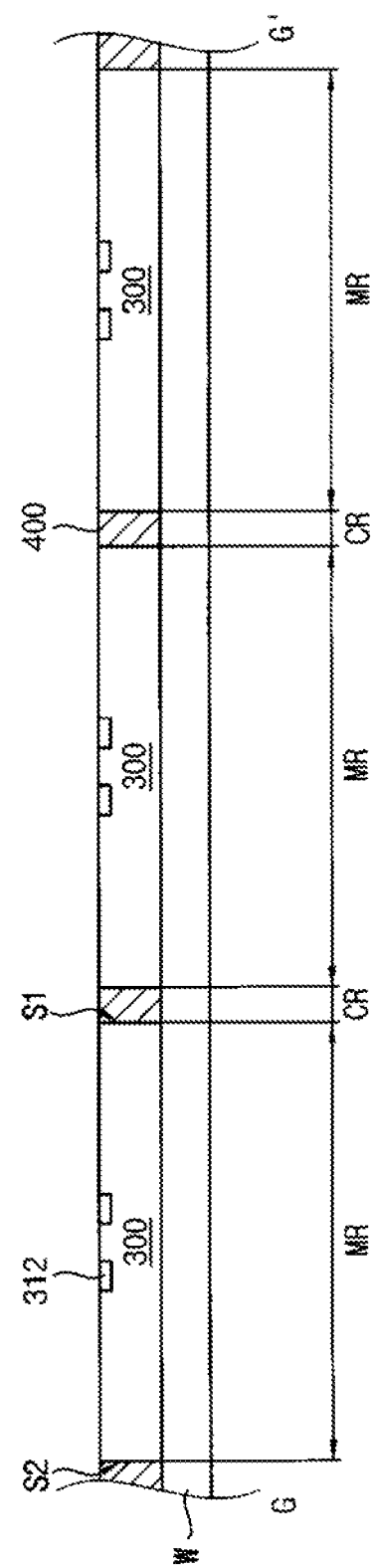
Figure 19:
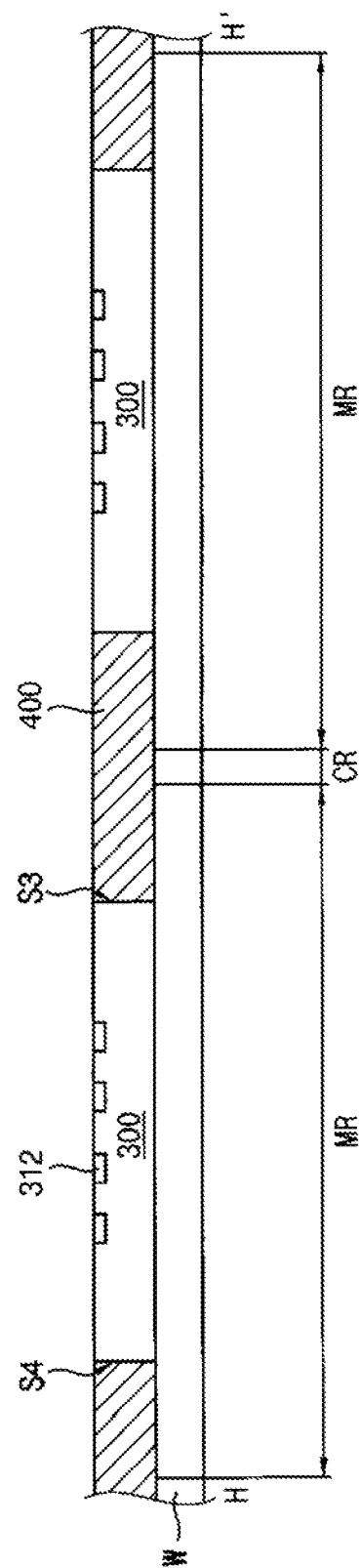

Referring to FIGS. 17 to 19, a semiconductor chip 300 may be arranged on a wafer substrate W, and then, a molding member 400 may be formed on the wafer substrate W to cover the semiconductor chip 300.

In an example embodiment, the wafer substrate W may be used as a base substrate on which a plurality of semiconductor chips is arranged and the molding member is formed to cover the semiconductor chips. The wafer substrate W may have a shape corresponding to a wafer on which semiconductor manufacturing processes are performed. The wafer substrate W may include, for example, a silicon substrate, a glass substrate, or a non-metal or metal plate.

The wafer substrate W may include a package region MR (in which the semiconductor chip is mounted) and a cutting region CR (surrounding the package region MR). As described below, the redistribution wiring layer and the molding member on the wafer substrate W may be cut along the cutting region CR dividing a plurality of the package regions MR.

In an example embodiment, the semiconductor chip 300 may have a plurality of chip pads 312 on a first surface (e.g., active surface) thereof. The semiconductor chip 300 may be arranged on the wafer substrate W such that a second surface (opposite to the first surface thereof) faces toward the wafer substrate W.

In an example embodiment, the semiconductor chip 300 may be adhered on the wafer substrate W by a separation layer. The separation layer may include a polymer tape acting as a temporary adhesive. The separation layer may include a material capable of losing adhesive strength when it is subjected to light or heat.

In an example embodiment, the molding member 400 may be formed on the wafer substrate W to cover a side surface of the semiconductor chip 300. The molding member 400 may include, for example, an epoxy molding compound EMC. The molding member 400 may be formed by a molding process, a screen printing process, a lamination process, etc. In an implementation, the molding member 400 may expose the second surface of the semiconductor chip 300 and may cover only the side surfaces of the semiconductor chip 300.

Figure 20:
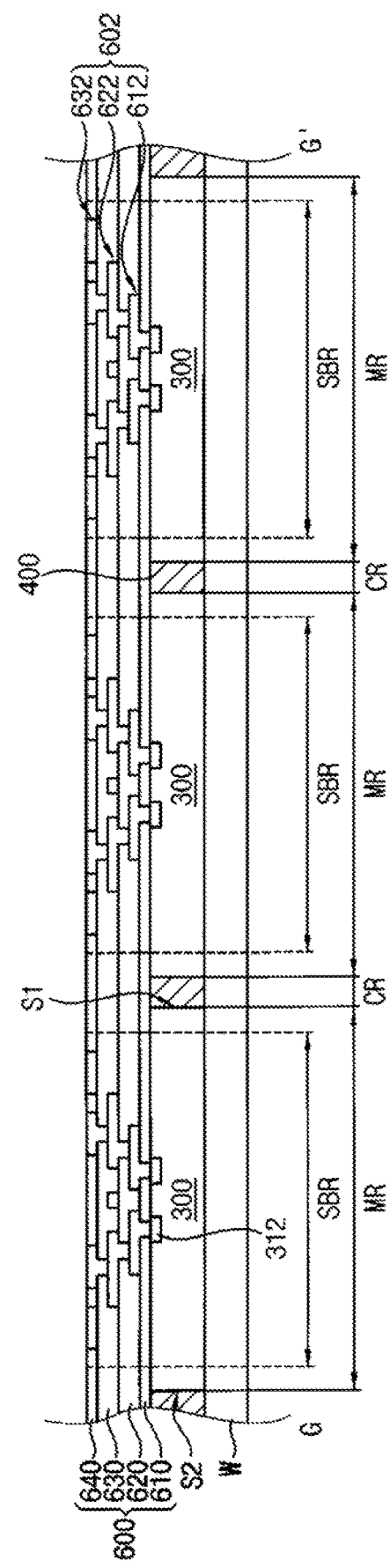
Figure 21:
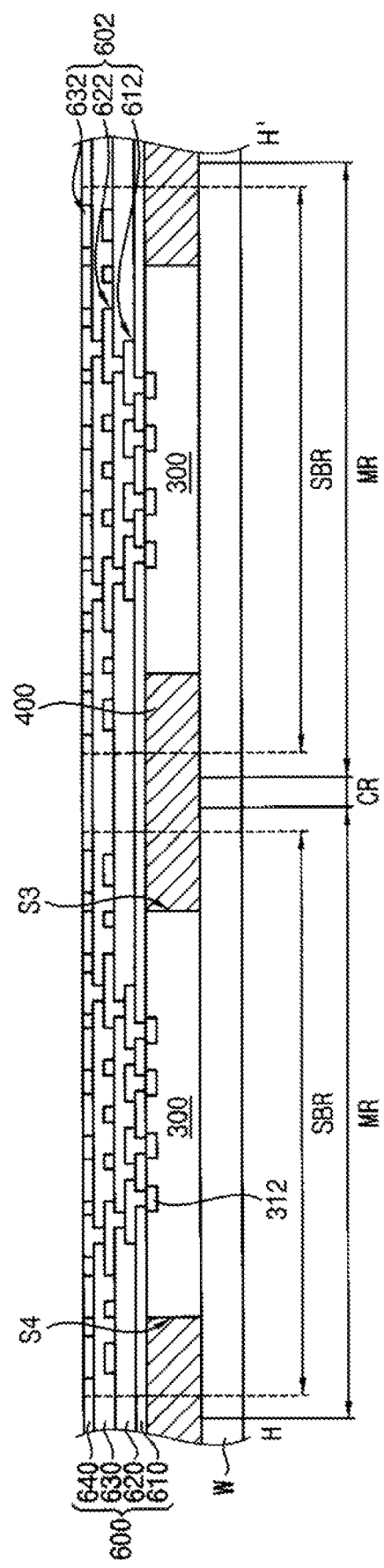

Referring to FIGS. 20 and 21, a first insulation layer 610 may be formed on the molding member 400 to have first openings that expose the chip pads 312 of the semiconductor chip 300, respectively. The insulation layer may include a polymer layer, a dielectric layer, etc. For example, the insulation layer may include a photosensitive insulation layer such as photo imageable dielectric PID. The insulation layer may be formed by a vapor deposition process, a spin coating process, etc.

Then, first redistribution wirings 612 may be formed on the first insulation layer 610 to directly contact the first redistribution wirings 612 through the first openings, respectively.

The first redistribution wiring may be formed by forming a seed layer on a portion of the first insulation layer 610 and in the first opening, patterning the seed layer, and performing an electrolytic plating process. The first redistribution wiring may include aluminum (Al), copper (Cu), tin (Sn), nickel (Ni), gold (Au), platinum (Pt), or an alloy thereof. In an implementation, the redistribution wiring may be formed by an electroless plating process, a vapor deposition process, etc.

Then, a second insulation layer 620 and second redistribution wirings 622 may be formed on the first insulation layer 610 and the first redistribution wirings 612. The second insulation layer 620 may have second openings that expose the first redistribution wirings 612, respectively. The second redistribution wiring 622 may be formed on a portion of the second insulation layer 620 and a portion of the first redistribution wiring 612.

Then, a third insulation layer 630 and third redistribution wirings 632 may be formed on the second insulation layer 620 and the second redistribution wirings 622. The third insulation layer 630 may have third openings that expose the second redistribution wirings 622, respectively. The third redistribution wiring 632 may be formed on a portion of the third insulation layer 630 and a portion of the second redistribution wiring 622.

Then, a fourth insulation layer 640 may be formed on the third insulation layer 630. The fourth insulation layer 640 may expose portions of the third redistribution wirings 632 on the third insulation layer 630.

Thus, a redistribution wiring layer 600 having redistribution wirings 602 electrically connected to the chip pads 312 of the semiconductor chip 300 respectively may be formed on the molding member 400. The number, arrangements, etc., of the insulation layers of the redistribution wiring layer may be varied.

Figure 22:
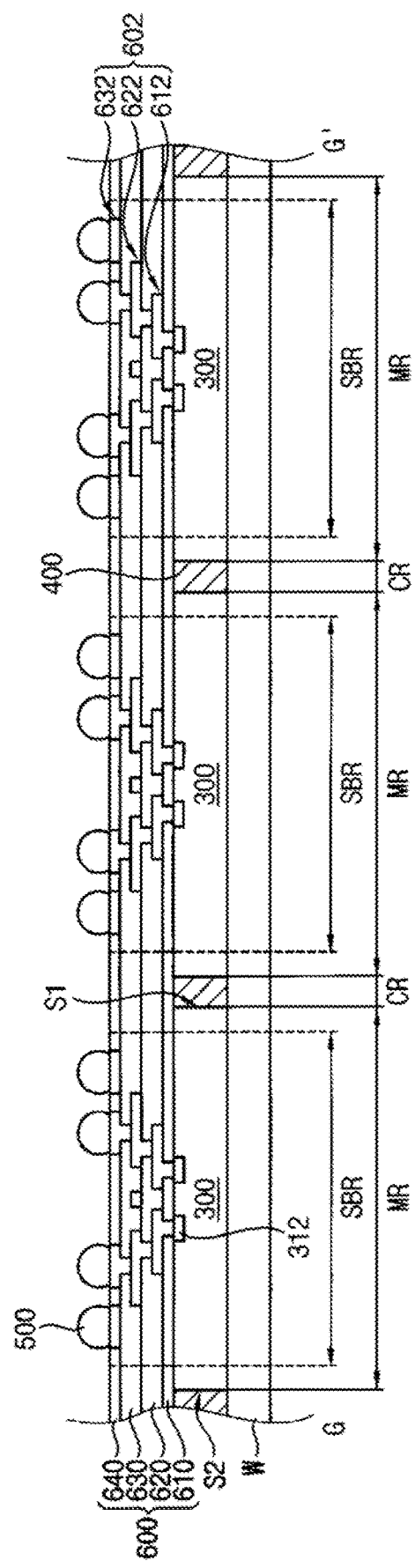
Figure 23:
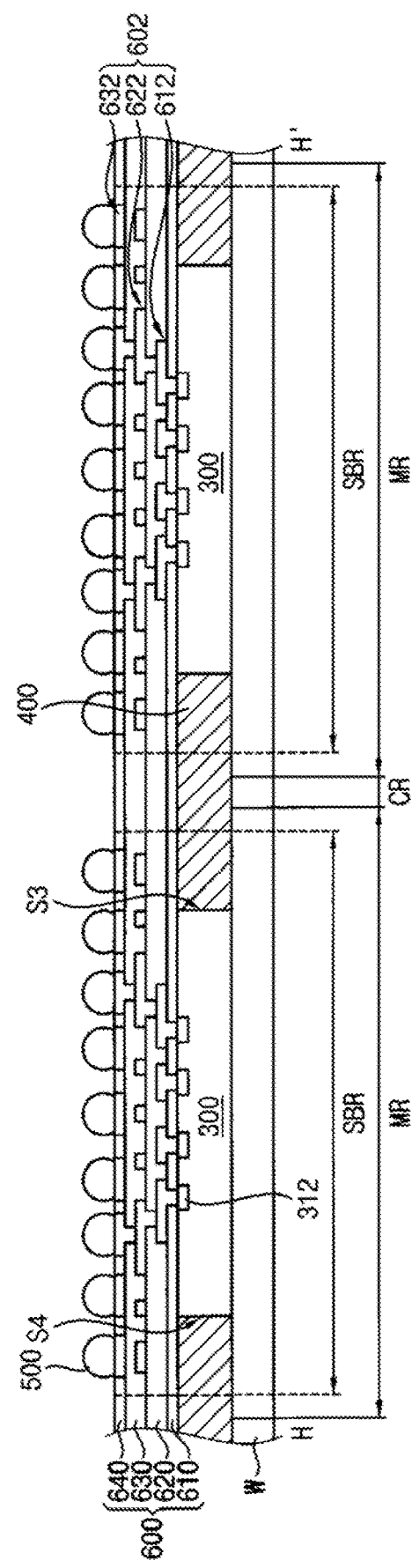

Referring to FIGS. 22 and 23, outer connection members 500 may be formed on the redistribution wiring layer 600 to be electrically connected to the redistribution wirings 602. For example, a solder ball as the outer connection member 500 may be disposed on the portion of the third redistribution wiring 632. The portion of the third redistribution wiring 632 may serve as a landing pad, that is, a package pad.

Then, the redistribution wiring layer 600 may be formed to include fan out type solder ball landing pads which are formed on the wafer substrate P corresponding to each die of a wafer by performing semiconductor manufacturing processes.

In an example embodiment, a connection region SBR on which the solder balls are disposed may be defined on the redistribution wiring layer 600. A first side surface S1 and a second side surface S2 of the semiconductor chip 300 may be positioned outside the connection region SBR, and a third side surface S3 and a fourth side surface S4 of the semiconductor chip 300 may be positioned within the connection region SBR. When viewed in plan view, both sides of a first region of the semiconductor chip 300 between the first side surface S1 and the second side surface S2 may protrude outwardly from the connection region SBR, and both sides of a second region of the semiconductor chip 300 between the third side surface S3 and the fourth side surface S4 may be positioned within the connection region SBR.

Figure 24:
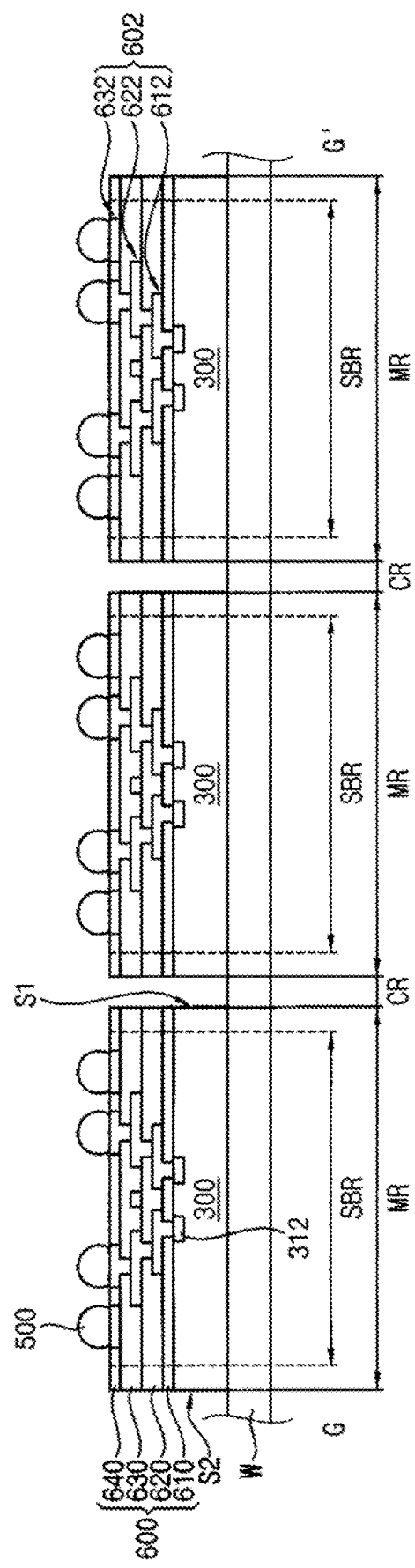
Figure 25:
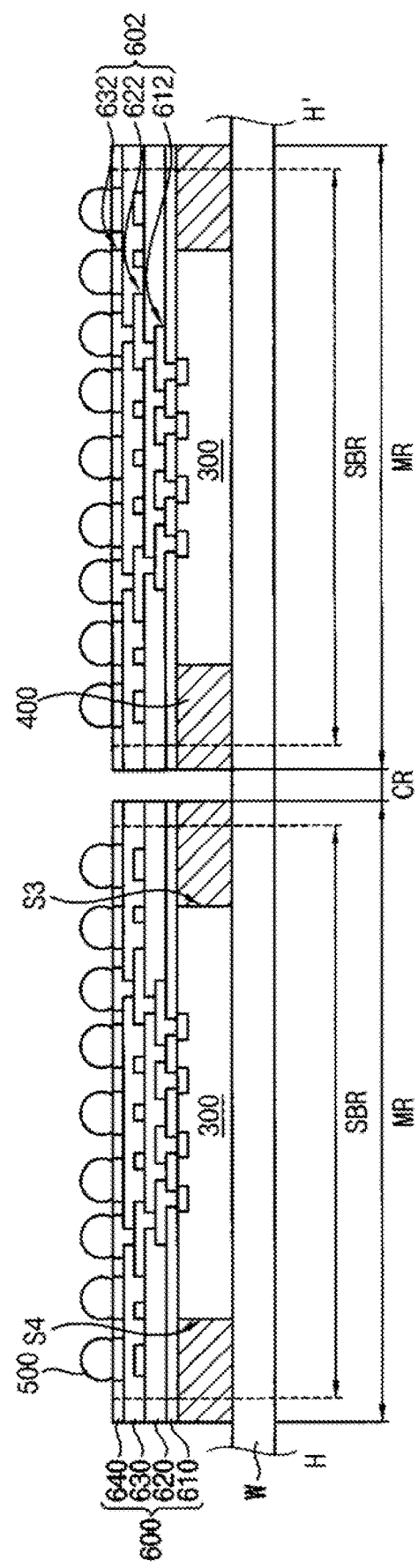

Referring to FIGS. 24 and 25, the redistribution wiring layer 600 and the molding member 400 may be cut to form individual semiconductor packages.

The redistribution wiring layer 600 may be divided by a sawing process to complete a fan out package.

The molding member 400 may be partially removed by the sawing process to expose the first side surface S1 and the second side surface S2 of the semiconductor chip 300. On the other hand, the molding member 400 may be formed to surround the third side surface S3 and the fourth side surface S4 of the semiconductor chip 300.

Figure 26:
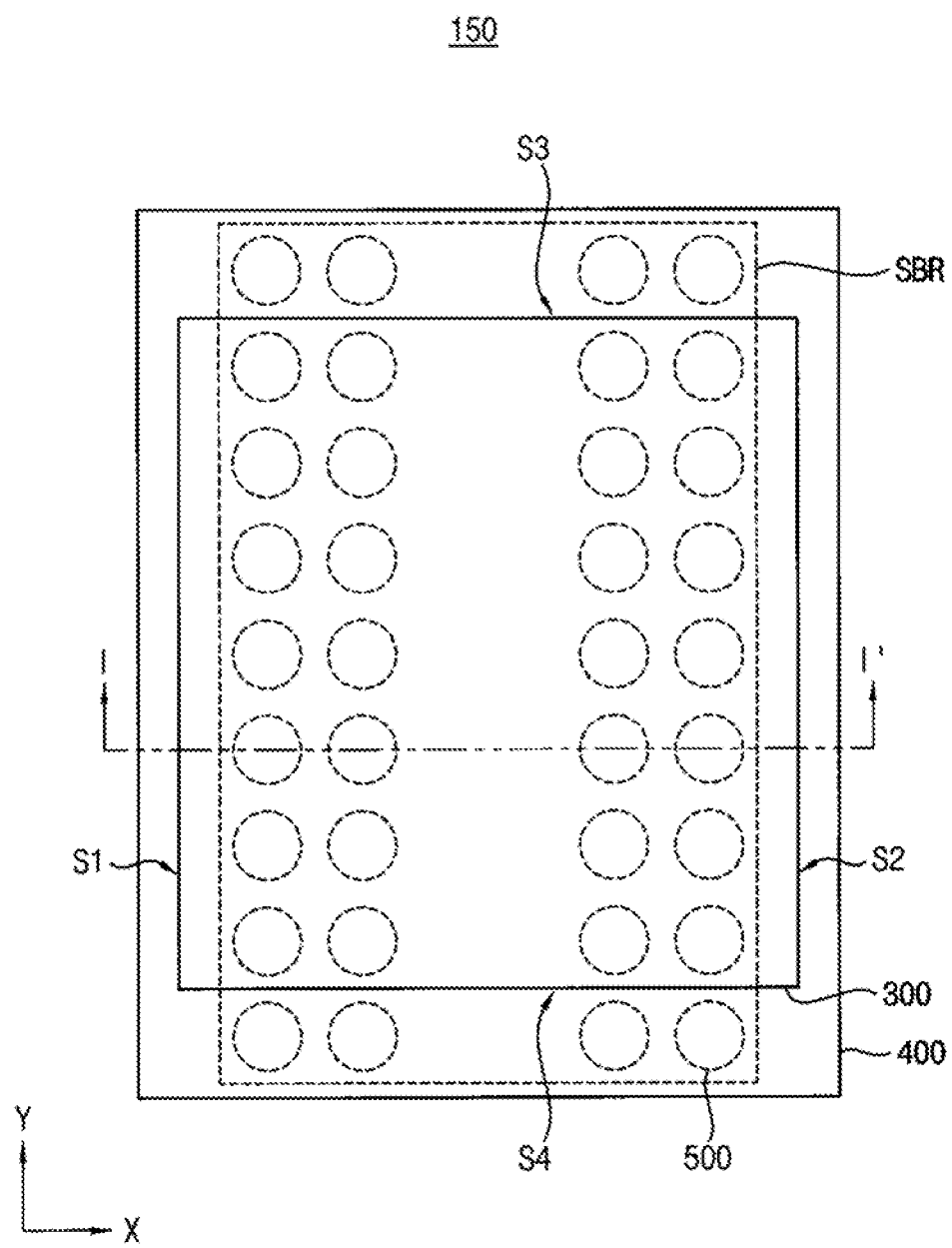
FIG. 26 is a plan view illustrating a semiconductor package in accordance with a comparative example.
Figure 27:
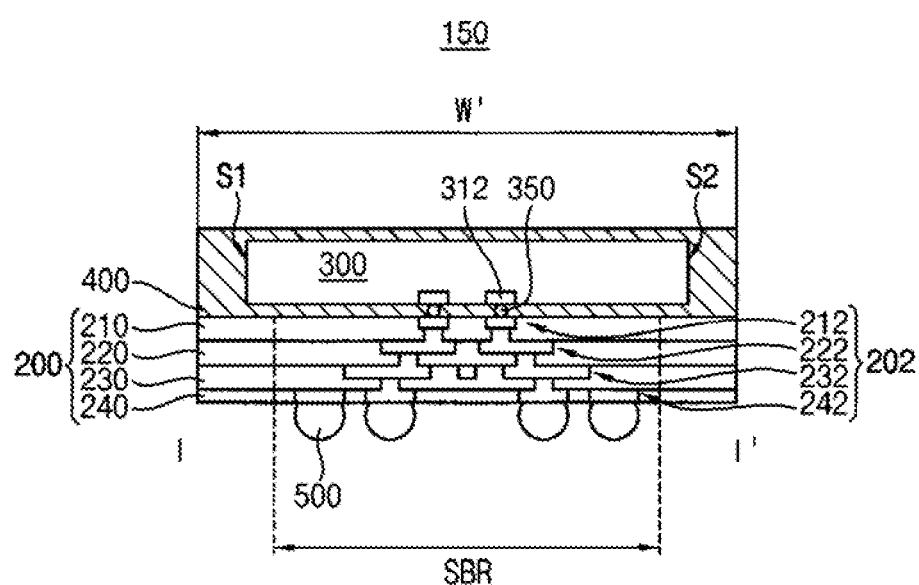
FIG. 27 is a cross-sectional view taken along the line I-I' in FIG. 26.

FIG. 26 is a plan view illustrating a semiconductor package in accordance with a comparative example. FIG. 27 is a cross-sectional view taken along the line I-I' in FIG. 26.

Referring to FIGS. 26 and 27, a semiconductor package 150 according to a comparative example may include a molding member 400 on a redistribution wiring layer 200 to cover all side surfaces including a first side surface S1 and a second side surface S2 of the semiconductor chip 300.

Because the molding member 400 covers the first side surface S1 and the second side surface S2 of the semiconductor chip 300, a length in a second direction (X direction of the molding member 400, that is, a width W' of the semiconductor package 150, may be increased more by the molding member 400.

In a comparative example, the length in the second direction (X direction) of the molding member 400, that is, the width W' of the semiconductor package 150, may be 9.5 mm. On the other hand, the width W of the semiconductor package 100 in FIG. 2 may be 8.34 mm.

Accordingly, a semiconductor package according to example embodiments may have a reduced size (width) when compared with a semiconductor package according to a comparative example. Thus, the semiconductor package according to example embodiments may provide high speed characteristics in a more efficiently packaged memory module.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

By way of summation and review, it may be important to minimize a size of a semiconductor package to reduce a channel length. However, a package pad region, on which the solder balls are disposed, may be standardized. Thus, it may be desirable to reduce an overall package size while adhering to the standard.

As described above, embodiments relate to a fan out package and a method of manufacturing the same.

Example embodiments may provide a semiconductor package having a minimized size and capable of securing improved high speed characteristics.

A length in the second direction of the molding member, that is, a width of the semiconductor package, may be minimized while adhering to the standard. Thus, a distance between the solder ball and a terminal of a module substrate may be minimized to thereby secure improved high speed characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a semiconductor chip having a first surface that is an active surface, a second surface opposite the first surface, and first, second, third, and fourth side surfaces each extending between the first surface and the second surface of the semiconductor chip, and having chip pads at the first surface of the semiconductor chip, the first and second side surfaces of the semiconductor chip extending in a first direction and being opposite to each other, and the third and fourth side surfaces of the semiconductor chip extending in a second direction and being opposite to each other and each connecting to the first and second side surfaces of the semiconductor chip;
    a redistribution wiring layer having a first surface, a second surface opposite the first surface, and first, second, third, and fourth side surfaces each extending between the first surface and the second surface, the first surface of the redistribution wiring layer being attached to the first surface of the semiconductor chip, and including a plurality of redistribution wirings electrically connected to the chip pads, the first and second side surfaces of the redistribution wiring layer being opposite to each other, and the third and fourth side surfaces of the redistribution wiring layer being opposite to each other and each connecting to the first and second side surfaces of the redistribution wiring layer;
    a molding member covering the third and fourth side surfaces of the semiconductor chip, and exposing the first and second side surfaces of the semiconductor chip; and
    outer connection members arranged in a connection region defined on an outer surface of the redistribution wiring layer, and electrically connected to the plurality of redistribution wirings,
    wherein the first and second side surfaces of the semiconductor chip are vertically aligned with the first and second side surfaces of the redistribution wiring layer, and the third and fourth side surfaces of the semiconductor chip are not vertically aligned with the third and fourth side surfaces of the redistribution wiring layer.

2. The semiconductor package of claim 1, wherein a length of the connection region in the second direction is less than a distance between the first and second side surfaces of the semiconductor chip, and a length of the connection region in the first direction is greater than a distance between the third and fourth side surfaces of the semiconductor chip.

3. The semiconductor package of claim 2, wherein the length of the connection region in the second direction is within a range of from 6 mm to 8 mm, and the length of the connection region in the first direction is within a range of from 9 mm to 11 mm.

4. The semiconductor package of claim 2, wherein a length of the redistribution wiring layer in the second direction is the same as the distance between the first and second side surfaces of the semiconductor chip, and a length of the redistribution wiring layer in the first direction is greater than the distance between the third and fourth side surfaces of the semiconductor chip.

5. The semiconductor package of claim 4, wherein the length of the redistribution wiring layer in the second direction is within a range of from 7 mm to 9 mm, and the length of the redistribution wiring layer in the first direction is within a range of from 10 mm to 12 mm.

6. The semiconductor package of claim 1, wherein the chip pads of the semiconductor chip are electrically connected to the plurality of redistribution wirings by conductive bumps.

7. The semiconductor package of claim 1, wherein the redistribution wiring layer includes a first insulation layer on the lower surface of the molding member and having openings that expose the chip pads of the semiconductor chip.

8. The semiconductor package of claim 7, wherein a first redistribution wiring of the plurality of redistribution wirings directly contacts one of the chip pads through one of the openings.

9. The semiconductor package of claim 1, wherein the semiconductor chip is arranged on the redistribution wiring layer such that the first surface of the semiconductor chip faces toward the redistribution wiring layer.

10. The semiconductor package of claim 1, wherein the second surface of the semiconductor chip is exposed by the molding member.

11. The semiconductor package of claim 1, wherein:
    the molding member has first, second, third, and fourth side surfaces,
    the first and second side surfaces of the molding member are vertically aligned with the first and second side surfaces of the semiconductor chip and are vertically aligned with the first and second side surfaces of the redistribution wiring layer, and
    the third and fourth side surfaces of the molding member are not vertically aligned with the third and fourth side surfaces of the semiconductor chip, and are vertically aligned with the third and fourth side surfaces of the redistribution wiring layer.

12. The semiconductor package of claim 1, wherein, in a plan view, the semiconductor chip has an overall length in the first direction that is the same as an overall length of the molding member in the first direction, and the semiconductor chip has an overall length in the second direction that is less than an overall length of the molding member in the second direction.

13. A semiconductor package, comprising:
    a semiconductor chip having chip pads on a first surface, having first and second side surfaces extending in a direction parallel with a first direction perpendicular to the first surface and opposite to each other, and having third and fourth side surfaces extending in a direction parallel with a second direction perpendicular to the first direction and opposite to each other;
a molding member covering the third and fourth side surfaces of the semiconductor chip, and exposing the first and second side surfaces of the semiconductor chip;
a redistribution wiring layer on a lower surface of the molding member and covering the first surface of the semiconductor chip, and including a plurality of redistribution wirings electrically connected to the chip pads; and
outer connection members arranged in a connection region defined on an outer surface of the redistribution wiring layer, and electrically connected to the plurality of redistribution wirings,
wherein a length of the redistribution wiring layer in the second direction is the same as a distance between the first and second side surfaces of the semiconductor chip, and a length of the redistribution wiring layer in the first direction is greater than a distance between the third and fourth side surfaces of the semiconductor chip.

14. The semiconductor package of claim 13, wherein the length of the connection region in the second direction is within a range of from 6 mm to 8 mm, and the length of the connection region in the first direction is within a range of from 9 mm to 11 mm.

15. The semiconductor package of claim 13, wherein the length of the redistribution wiring layer in the second direction is within a range of from 7 mm to 9 mm, and the length of the redistribution wiring layer in the first direction is within a range of from 10 mm to 12 mm.

16. The semiconductor package of claim 13, wherein, when viewed in plan view, the first and second side surfaces of the semiconductor chip are positioned outside the connection region, and the third and fourth side surfaces of the semiconductor chip are positioned within the connection region.

17. A semiconductor package, comprising:
a redistribution wiring layer including a plurality of redistribution wirings;
a semiconductor chip arranged on an upper surface of the redistribution wiring layer, the semiconductor chip having chip pads on a first surface, having first and second side surfaces extending in a direction parallel with a first direction perpendicular to the first surface and opposite to each other, and having third and fourth side surfaces extending in a direction parallel with a second direction perpendicular to the first direction and opposite to each other;
a molding member on the upper surface of the redistribution wiring layer, covering the third and fourth side surfaces of the semiconductor chip and exposing the first and second side surfaces of the semiconductor chip; and
outer connection members arranged in a connection region defined on a lower surface of the redistribution wiring layer, and electrically connected to the plurality of redistribution wirings,
wherein a length of the redistribution wiring layer in the second direction is the same as a distance between the first and second side surfaces of the semiconductor chip, and a length of the redistribution wiring layer in the first direction is greater than a distance between the third and fourth side surfaces of the semiconductor chip.

18. The semiconductor package of claim 17, wherein, when viewed in plan view, the first and second side surfaces of the semiconductor chip are positioned outside the connection region, and the third and fourth side surfaces of the semiconductor chip are positioned within the connection region.

19. The semiconductor package of claim 18, wherein a length of the connection region in the second direction is less than the distance between the first and second side surfaces of the semiconductor chip, and a length of the connection region in the first direction is greater than the distance between the third and fourth side surfaces of the semiconductor chip.

20. The semiconductor package of claim 19, wherein the length of the connection region in the second direction is within a range of from 6 mm to 8 mm, and the length of the connection region in the first direction is within a range of from 9 mm to 11 mm.

* * * * *